US007460592B2

(12) United States Patent
Yamaguchi et al.

(10) Patent No.: US 7,460,592 B2
(45) Date of Patent: Dec. 2, 2008

(54) APPARATUS FOR MEASURING JITTER AND METHOD OF MEASURING JITTER

(75) Inventors: Takahiro Yamaguchi, Tokyo (JP); Mani Soma, Seattle, WA (US); Masahiro Ishida, Tokyo (JP)

(73) Assignee: Advantest Corporation, Tokyo (JP)

( * ) Notice: Subject to any disclaimer, the term of this patent is extended or adjusted under 35 U.S.C. 154(b) by 599 days.

(21) Appl. No.: 11/122,262

(22) Filed: May 4, 2005

(65) Prior Publication Data

US 2006/0251162 A1 Nov. 9, 2006

(51) Int. Cl.
*H04B 3/46* (2006.01)
*H04B 17/00* (2006.01)
*H03K 9/00* (2006.01)

(52) U.S. Cl. ........................ 375/226; 375/224; 375/316

(58) Field of Classification Search ......... 375/224–228, 375/316
See application file for complete search history.

(56) References Cited

U.S. PATENT DOCUMENTS

| | | | | |
|---|---|---|---|---|
| 5,818,872 | A * | 10/1998 | Gupta | 375/222 |
| 6,246,717 | B1 * | 6/2001 | Chen et al. | 375/226 |
| 6,400,129 | B1 * | 6/2002 | Yamaguchi et al. | 324/76.82 |
| 6,460,001 | B1 * | 10/2002 | Yamaguchi et al. | 702/69 |
| 6,621,860 | B1 * | 9/2003 | Yamaguchi et al. | 375/226 |
| 6,775,321 | B1 * | 8/2004 | Soma et al. | 375/226 |
| 6,795,496 | B1 * | 9/2004 | Soma et al. | 375/226 |
| 6,898,535 | B2 * | 5/2005 | Draving | 702/69 |
| 6,922,439 | B2 * | 7/2005 | Yamaguchi et al. | 375/226 |
| 6,934,648 | B2 * | 8/2005 | Hanai et al. | 702/69 |
| 6,990,417 | B2 * | 1/2006 | Yamaguchi et al. | 702/69 |
| 7,054,358 | B2 * | 5/2006 | Yamaguchi et al. | 375/226 |
| 7,203,229 | B1 * | 4/2007 | Ishida et al. | 375/226 |
| 7,206,340 | B2 * | 4/2007 | Jungerman et al. | 375/226 |
| 7,254,168 | B2 * | 8/2007 | Guenther | 375/226 |
| 2002/0159514 | A1 * | 10/2002 | Miyoshi et al. | 375/226 |
| 2002/0163958 | A1 * | 11/2002 | Yamaguchi et al. | 375/226 |
| 2003/0125888 | A1 * | 7/2003 | Yamaguchi et al. | 702/69 |
| 2003/0202573 | A1 * | 10/2003 | Yamaguchi et al. | 375/226 |
| 2004/0062301 | A1 * | 4/2004 | Yamaguchi et al. | 375/226 |
| 2004/0146097 | A1 * | 7/2004 | Jungerman et al. | 375/226 |
| 2005/0031029 | A1 * | 2/2005 | Yamaguchi et al. | 375/226 |
| 2005/0080574 | A1 * | 4/2005 | Draving | 702/69 |
| 2005/0185708 | A1 * | 8/2005 | Yamaguchi et al. | 375/224 |
| 2005/0232345 | A1 * | 10/2005 | Ward et al. | 375/224 |

(Continued)

OTHER PUBLICATIONS

M. Lauterbach and T. Wey, Analyze Jitter to Improve High-Speec Design, IEEE Spectrum, pp. 62-67, Jul. 2000.

*Primary Examiner*—Chieh M Fan
*Assistant Examiner*—Jason M. Perilla
(74) *Attorney, Agent, or Firm*—Osha•Liang LLP

(57) ABSTRACT

There is provided a jitter measuring apparatus for measuring jitter in a signal-under-measurement, having a signal converting section for calculating a spectrum of the signal-under-measurement, a bandwidth calculating section for calculating frequency where a saturation rate of a value of the integrated spectrum of the signal-under-measurement becomes almost equal to a saturation rate set in advance in a band-to-be-measured set in advance as upper cutoff frequency of the band-to-be-measured to calculate the jitter and a jitter calculating section for measuring the jitter in the signal-under-measurement based on the spectaum in the band-to-be-measured of the signal-under-measurement.

9 Claims, 13 Drawing Sheets

100

U.S. PATENT DOCUMENTS

2005/0267696 A1* 12/2005 Yamaguchi et al. ........... 702/57
2005/0286627 A1* 12/2005 Tabatabaei .................. 375/238
2006/0018418 A1* 1/2006 Ichiyama et al. ............ 375/376
2006/0133469 A1* 6/2006 Froelich et al. ............. 375/226
2006/0182170 A1* 8/2006 Ichiyama et al. ............ 375/226
2006/0229836 A1* 10/2006 Stephens ..................... 702/69

* cited by examiner

UPPER CUT-OFF FREQUENCY

| α | ATTRIBUTE \ TYPE | TIMING JITTER | PERIOD JITTER |
|---|---|---|---|
| −4 | RANDOM-WALK FREQUENCY NOISE | $8f_L$ | $30f_L$ |
| −3 | FLICKER FREQUENCY NOISE | $8f_L$ | $70f_L$ |
| −2 | WHITE FREQUENCY NOISE | $60f_L$ | $80f_L$ |
| −1 | FLICKER FREQUENCY NOISE | $f_0$ | $f_0$ |
| 0 | WHITE PHASE NOISE | $f_0$ | $f_0$ |

*FIG. 7A*

UPPER CUT-OFF FREQUENCY

| α | ATTRIBUTE \ TYPE | TIMING JITTER | PERIOD JITTER |
|---|---|---|---|
| −4 | RANDOM-WALK FREQUENCY NOISE | $0.08f_0$ | $0.3f_0$ |
| −3 | FLICKER FREQUENCY NOISE | $0.08f_0$ | $0.7f_0$ |
| −2 | WHITE FREQUENCY NOISE | $0.6f_0$ | $0.8f_0$ |
| −1 | FLICKER FREQUENCY NOISE | $f_0$ | $f_0$ |
| 0 | WHITE PHASE NOISE | $f_0$ | $f_0$ |

*FIG. 7B*

APPARATUS FOR MEASURING JITTER AND METHOD OF MEASURING JITTER

FIELD OF THE INVENTION

The present invention relates to a jitter measuring apparatus and a jitter measuring method for measuring jitter in a signal-under-measurement.

DESCRIPTION OF RELATED ART

Conventionally, period jitter in a signal-under-measurement is being measured by using a frequency counter, a time interval analyzer or the like as fluctuation of zero-crossing time interval of the signal-under-measurement. Because the time interval analyzer also measures jitter by using a built-in frequency counter, those measuring methods are homogeneous in that both of them count time interval.

It is also known to be able to readily measure period jitter by using a time interpolator which is built in a real-time oscilloscope (M. Lauterbach and T. Wey, "Analyze Jitter to Improve High-Speed Design, IEEE Spectrum, pp. 62-67, July 2000).

The present applicant also has proposed a method of converting a signal-under-measurement into an analytical signal, calculating an instantaneous phase of the signal-under-measurement from the analytical signal and measuring jitter in the signal-under-measurement from noise in the instantaneous phase. This method enables to measure jitter values compatible with the time interval analyzer.

Thus, the various methods have been known as methods for measuring jitter in a signal-under-measurement.

By the way, the instantaneous phase noise and timing jitter in the signal-under-measurement have low-pass characteristics and a difference between the period jitter and timing jitter has band pass characteristics. The jitter value measured by the various methods described above varies sensitively depending on an observed bandwidth of the signal-under-measurement.

Accordingly, in order to measure the jitter value in the signal-under-measurement or calculate a bit error rate of the signal-under-measurement from the measured jitter value, it is preferable to optimally determine the bandwidth to be observed corresponding to a jitter type to be measured.

That is, if the bandwidth to be observed is too narrow, the jitter is underestimated and if the bandwidth to be observed is too wide, the jitter is overestimated or it takes an excessive time for the measurement. However, in the past, the method for determining the optimum bandwidth to be observed for measuring jitter in the signal-under-measurement has been lacking. Therefore, since the conventional jitter measuring method doesn't use the optimum bandwidth, it suffers from inaccuracy associated with the measured jitter values or inefficient measurements.

Accordingly, it is an object of the invention to provide a jitter measuring apparatus or a jitter measuring method that is capable of solving the above-mentioned problem. This object may be achieved through the combination of features described in independent claims of the invention. Dependent claims thereof specify preferable embodiments of the invention.

SUMMARY OF INVENTION

In order to solve the above-mentioned problem, according to a first aspect of the invention, there is provided a jitter measuring apparatus for measuring jitter in a signal-under-measurement, having a signal converting section for calculating a spectrum of the signal-under-measurement, a bandwidth calculating section for calculating frequency where a saturation rate of an integrated value of the spectrum of the signal-under-measurement becomes almost equal to a saturation rate set in advance in a band-to-be-measured set in advance as upper cutoff frequency of the band-to-be-measured to be looked up to calculate the jitter and a jitter calculating section for measuring the jitter in the signal-under-measurement based on the spectrum in the band-to-be-measured of the signal-under-measurement.

Preferably, the bandwidth calculating section calculates the upper cutoff frequency based on the inclination of the spectrum of the signal-under-measurement. The bandwidth calculating section may include an inclination detecting section for detecting inclination of straight lines approximating an envelope of the spectra and a cutoff frequency calculating section for calculating the upper cutoff frequency based on the inclination of the spectra.

The cutoff frequency calculating section may calculate the upper cutoff frequency by multiplying a calculating coefficient, which corresponds to the inclination of the spectra, to oscillating frequency or carrier frequency of said signal-under-measurement.

Preferably, the bandwidth calculating section has a table storage section for storing a coefficient table that correlates the inclination of the respective spectra with the calculating coefficient, whose value decreases as an absolute value of the inclination of the spectrum become large and the cutoff frequency calculating section calculates the upper cutoff frequency by using the calculating coefficient corresponding to the inclination of the spectrum.

The bandwidth calculating section may calculate the upper cutoff frequency based on a difference of levels between peak level of a fundamental and peak level of a second harmonic in the spectrum.

The cutoff frequency calculating section may also calculate the lower cutoff frequency of the band-to-be-measured based on the upper cutoff frequency and the inclination of the straight lines approximating the envelope of the spectrum.

The signal converting section may calculate a power-law spectrum of the signal-under-measurement as the spectrum of the signal-under-measurement.

According to a second aspect of the invention, there is provided a jitter measuring method for measuring jitter in a signal-under-measurement, having a signal converting step of calculating a spectrum of the signal-under-measurement, a bandwidth calculating step of calculating frequency where a saturation rate of an integrated value of the spectrum of the signal-under-measurement becomes almost equal to a threshold saturation rate set in advance as upper cutoff frequency of a band-to-be-measured to be looked up to calculate the jitter and a jitter calculating step of measuring the jitter in the signal-under-measurement based on the spectrum in the band-to-be-measured of the signal-under-measurement.

According to a third aspect of the invention, there is provided a jitter measuring apparatus for measuring jitter in a signal-under-measurement, having a signal converting section for converting the signal-under-measurement into an analytical signal, an instantaneous phase calculating section for calculating instantaneous phase of the signal-under-measurement based on the analytical signal, a linear component removing section for removing a linear component from the instantaneous phase to calculate instantaneous phase noise in the signal-under-measurement, a noise spectrum calculating section for calculating a spectrum of the instantaneous phase noise, a bandwidth calculating section for calculating frequency where a saturation rate of the integrated value of the spectrum of the instantaneous phase noise becomes almost equal to a threshold saturation rate set in advance in a band-to-be-measured in which the jitter is to be measured as upper cutoff frequency of the band-to-be-measured to be referred to calculate the jitter and a jitter calculating section for measuring the jitter in the signal-under-measurement based on the spectrum in the band-to-be-measured of the signal-under-measurement.

According to a fourth aspect of the invention, there is provided a jitter measuring method for measuring jitter in a signal-under-measurement, having a signal converting step of converting the signal-under-measurement into an analytical signal, an instantaneous phase calculating step of calculating instantaneous phase of the signal-under-measurement based on the analytical signal, a linear component removing step of removing a linear component from the instantaneous phase to calculate instantaneous phase noise in the signal-under-measurement, a noise spectrum calculating step of calculating a spectrum of the instantaneous phase noise, a bandwidth calculating step of calculating frequency where a saturation rate of an integrated value of the spectrum of the instantaneous phase noise becomes almost equal to a threshold saturation rate set in advance in a band-to-be-measured in which the jitter is to be measured as upper cutoff frequency of the band-to-be-measured to be looked up to calculate the jitter and a jitter calculating step of measuring the jitter in the signal-under-measurement based on the spectrum in the band-to-be-measured.

It is noted that the summary of the invention described above does not necessarily describe all necessary features of the invention. The invention may also be a sub-combination of the features described above.

BRIEF DESCRIPTION OF THE DRAWINGS

FIGS. 7A and 7B are one example of a coefficient table stored in a bandwidth calculating section.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
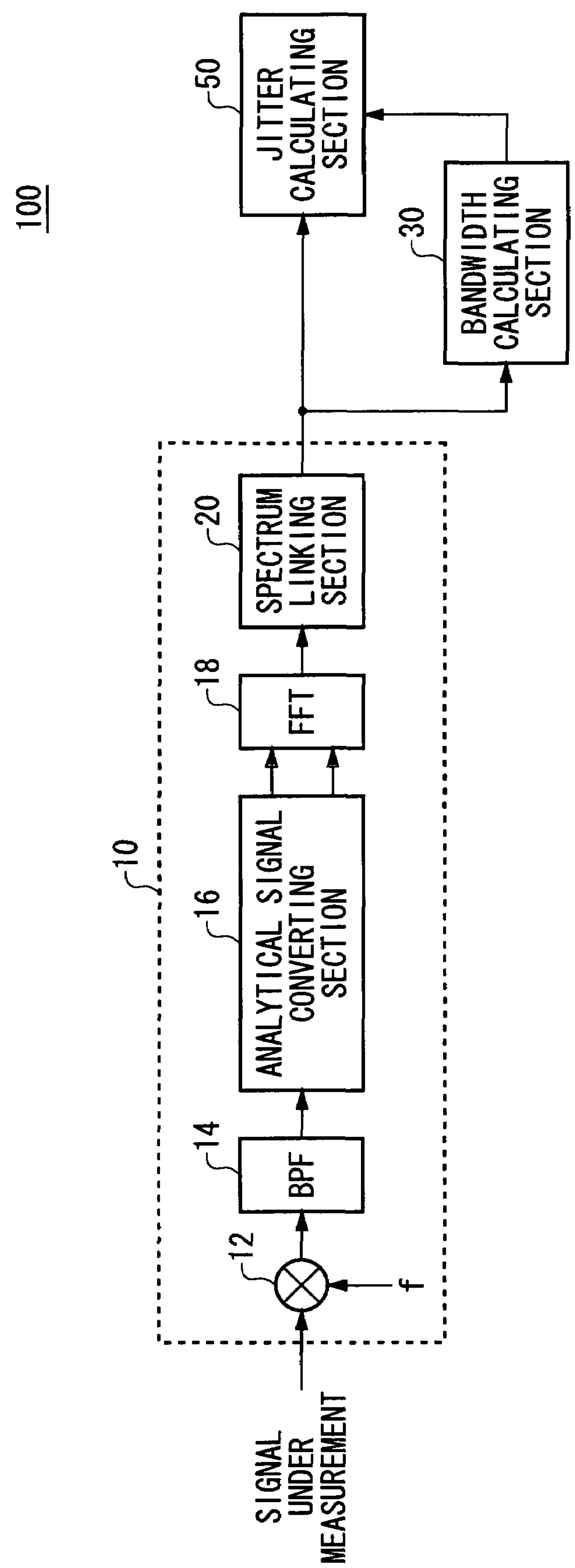
FIG. 1 is a diagram showing one exemplary configuration of a jitter measuring apparatus according to an embodiment of the invention.

FIG. 1 is a diagram showing one exemplary configuration of a jitter measuring apparatus 100 according to an embodiment of the invention. The jitter measuring apparatus 100 is an apparatus for measuring jitter such as timing jitter, period jitter and cycle-to-cycle jitter in a signal-under-measurement and has a signal converting section 10, a bandwidth calculating section 30 and a jitter calculating section 50.

The signal converting section 10 calculates a spectrum of the signal-under-measurement. In this example, the signal converting section 10 divides a broad frequency band of the signal-under-measurement into a plurality of frequency bands and sequentially calculates the spectra of the signal-under-measurement of the respective frequency bands. Then, it calculates the spectrum of the broadband signal-under-measurement by merging or concatenating the respective spectra. The signal converting section 10 has a frequency shifting section 12, a band pass filter 14, an analytical signal converting section 16, a Fourier transforming section 18 and a spectrum concatenating section 20.

The frequency shifting section 12 sequentially shifts the frequency of the signal-under-measurement so that the respective divided frequency bands coincide sequentially with the frequency band to be inputted to the band pass filter 14 and inputs them to the band pass filter 14. Here, the term 'sequentially' is not limited to processing the respective divided bands sequentially in order of the frequency. It also includes sequentially processing the respective divided bands in random order for instance.

The band pass filter 14 has filtering characteristics set in advance and sequentially passes a desirable band component of sequentially inputted signals. The analytical signal converting section 16 sequentially converts the signals sequentially outputted from the band pass filter 14 into analytical signals and outputs them to the Fourier transforming section 18. The analytical signal converting section 16 may be a circuit that outputs a Hilbert transformation pair of the inputted signal for example.

The Fourier transforming section 18 sequentially calculates spectra of the signals sequentially outputted from the analytical signal converting section 16. The spectrum concatenating section 20 merges the spectra sequentially calculated by the Fourier transform section 18 to calculate the spectrum in the entire band of the signal-under-measurement. For instance, the spectrum concatenating section 20 merges the spectra by shifting frequency of the respective spectra corresponding to the degree of frequency shift in the frequency shifting section 12.

The bandwidth calculating section 30 calculates a band-to-be-measured (reference band) in order to measure jitter. The bandwidth calculating section 30 calculates the band parameters such that an integrated value of a sideband spectrum of the signal-under-measurement in the band-to-be-measured becomes almost equal to an integrated value of the sideband spectrum found across the entire bandwidth. Here, 'almost equal' means that a saturation rate calculated from the ratio of the integrated value of the sideband spectrum of the signal-under-measurement over the band-to-be-measured to the integrated value of the sideband spectrum of the signal-under-measurement across the entire bandwidth is almost equal to 1.

The sideband spectrum may be a sideband of a carrier component in a power spectrum of the signal-under-measurement or a phase noise spectrum of the signal-under-measurement for example. When the spectrum is the spectrum of the phase noise, the jitter measuring apparatus 100 may have a configuration described later in FIG. 13.

The frequency where the integrated value of the spectrum over frequencies saturates is determined by an inclination of a straight line approximating an envelope of the spectra. The bandwidth calculating section 30 may calculate the band-to-be-measured based on the inclination of the straight line.

The band-to-be-measured wherein jitter is to be measured may be a bandwidth set by a user. The bandwidth calculating section 30 may also approximate a log magnitude spectrum outputted from the signal converting section 10 by straight lines and calculate its inclination.

The jitter calculating section 50 measures jitter in the signal-under-measurement based on the spectra of the signal-under-measurement over the band-to-be-measured.

Next, the operations of the bandwidth calculating section 30 and the jitter calculating section 50 will be explained in detail.

Figure 2:
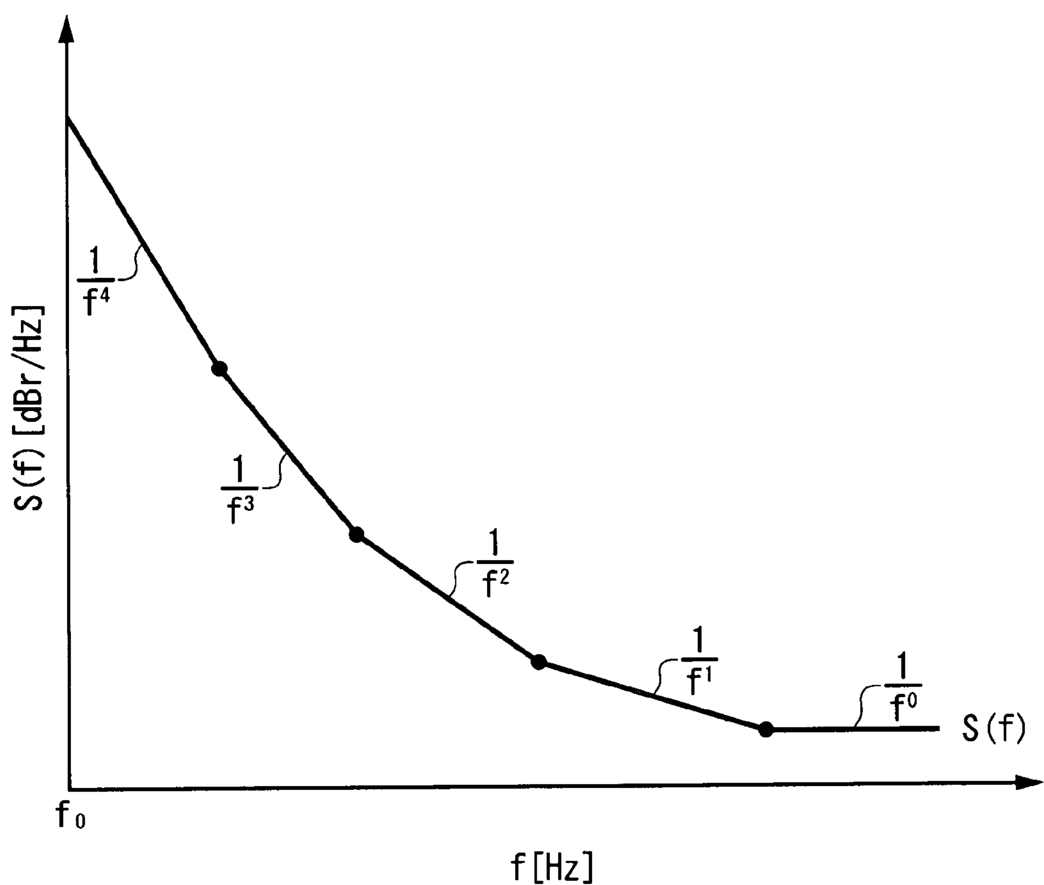
FIG. 2 is a graph showing an example of a spectrum S(f) of a signal-under-measurement approximated by straight lines.

FIG. 2 is a graph showing an exemplary spectrum S(f) of the signal-under-measurement approximated by straight lines. In FIG. 2, the axis of ordinate represents magnitude of the spectrum and the axis of abscissa represents log offset frequency from carrier frequency. In this example, the spectrum S(f) of the signal-under-measurement is a phase noise spectrum of the signal-under-measurement. However, because the sidebands power spectra of the signal-under-measurement depends on the phase noise spectra of the signal-under-measurement, the inclination of the sidebands power spectra is almost equal to the inclination of the sidebands of the phase noise spectra. Therefore, the bandwidth calculating section 30 may calculate the inclination either from the sidebands of the carrier component in the power spectrum of the signal-under-measurement or from the phase noise spectrum of the signal-under-measurement.

Still more, the bandwidth calculating section 30 may approximate the spectrum of the signal-under-measurement by the plurality of straight lines as shown in FIG. 2. This approximation may be carried out by using the least squares method or the like. A plurality of inclinations ($f^{\alpha}$ for example, where a may be an integer from −4 to 0 or may be an arbitrary real number) is given in advance to the bandwidth calculating section 30, so that the bandwidth calculating section 30 may approximate such that an error is minimized by using the plurality of straight lines having those inclinations.

A mean square value of the instantaneous phase noise is equal to the area under the phase noise spectrum curve and may be represented by the value obtained by integrating the phase noise. As $\alpha$, which corresponds to the inclination of the phase noise spectrum, changes from −4 to 2, the minimum bandwidth of the band-to-be-measured required for observing the mean square value of the instantaneous phase noise being saturated becomes wider and when $\alpha$ is −1 or 0, the mean square value of the instantaneous phase noise diverges.

The bandwidth calculating section 30 calculates the band-to-be-measured based on the frequency band necessary for saturating the integrated values for the respective phase noise straight lines. The jitter calculating section 50 can minimize the error and measuring time by enabling jitter measurement over such band-to-be-measured.

Figure 3:
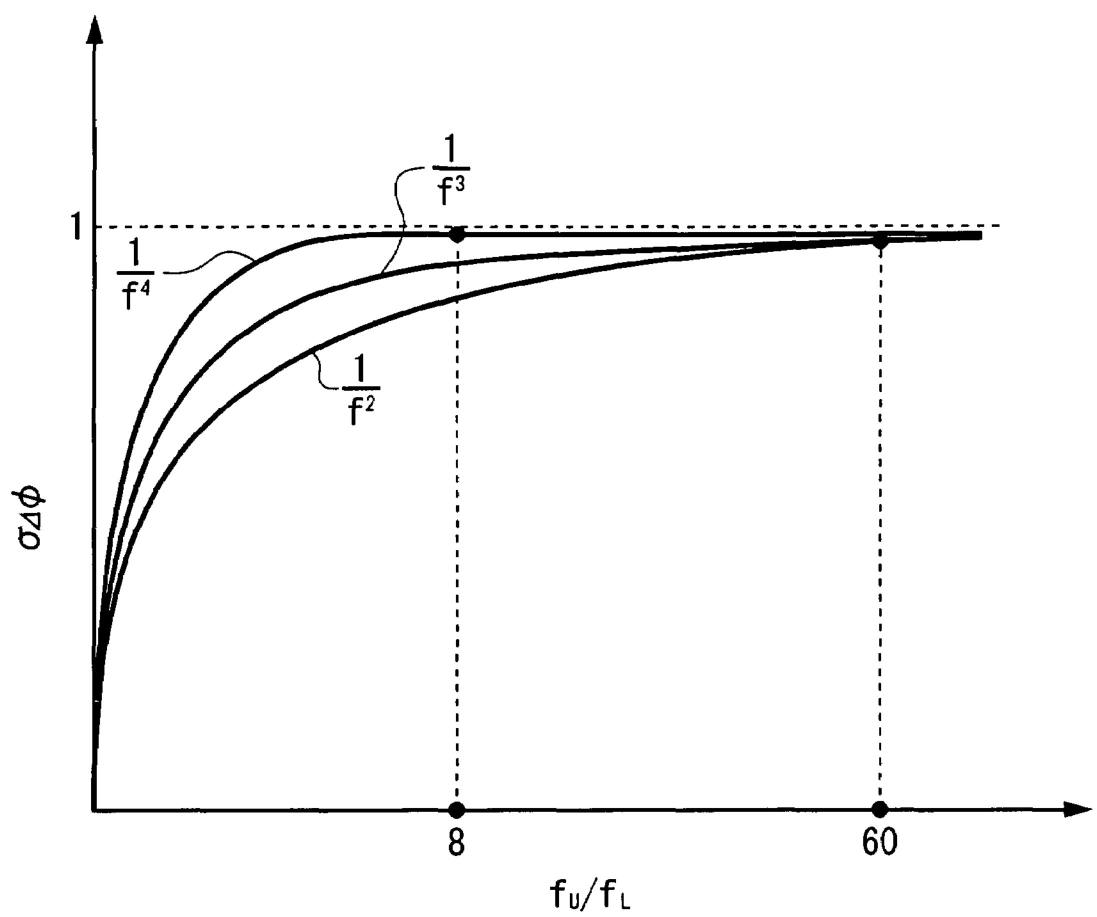
FIG. 3 is a graph showing one exemplary relationship between integrated values of a phase noise spectrum and a band-to-be-measured when a representing an inclination of the spectrum is −4 to −2.

FIG. 3 is a graph showing one exemplary relationship between the integrated spectra and the band-to-be-measured when a representing the inclination of the phase noise spectrum is −4 to −2. In FIG. 3, the axis of ordinate represents the integrated value and the axis of abscissa represents values of $(f_U/f_L)$ in log. Here, $f_U$ is the upper cutoff frequency of the band-to-be-measured, expressed as the offset frequency from the fundamental frequency $f_0$, and $f_L$ is the lower cutoff frequency of the band-to-be-measured. In the axis of ordinate, the ratio of the integrated spectra value over the band, which spans from the lower cutoff frequency to the upper cutoff frequency, to the integrated spectra value over the entire band is shown. For example, the fundamental frequency $f_0$ is oscillating frequency or carrier frequency of the signal-under-measurement.

As shown in FIG. 3, the integrated value saturates at the lower frequency as the absolute value of the inclination of the spectrum becomes large. For instance, when a representing the inclination is −4, the integrated value saturates when $f_U/f_L$ is around 8 and when $\alpha$ is −3 and −2, the integrated values saturate when $f_U/f_L$ is around 60. The bandwidth calculating section 30 calculates these offset frequencies as the upper cutoff frequency of the band-to-be-measured to the straight lines having the respective inclinations. For instance, the bandwidth calculating section 30 may store in advance a coefficient table that correlates each value of the inclinations with the upper cutoff frequency and provide the searched upper cutoff frequency corresponding to the calculated inclination.

Whether or not the respective integrated values have saturated may be set based on the tolerance error zone set in advance. For instance, when the allowance of the error is around 2%, offset frequency corresponding to an integrated value whose rate to the integrated value in the entire bandwidth is around 98% may be set as the upper cutoff frequency.

Although this example has been explained by using the phase noise spectrum, the same applies also when a timing jitter spectrum is used.

The lower cutoff frequency of the band-to-be-measured may be frequency equal to spectrum measuring frequency resolution in the signal converting section 10. Still more, the lower cutoff frequency may be frequency set in advance by the user. The user may supply the lower cutoff frequency based on an allowable measuring time, the phase noise in the signal converting section 10, specifications of a device-under-measurement and the like.

Still more, the bandwidth calculating section 30 may calculate the lower cutoff frequency based on a given upper cutoff frequency and the inclination of the spectrum. For instance, for the given upper cutoff frequency, the bandwidth calculating section 30 may calculate the lower cutoff frequency based on that when the integrated value of the spectrum saturates by setting which frequency as the lower cutoff frequency.

Measuring jitter in the band-to-be-measured in which the integrated spectrum saturates as described above allows the measuring time and the measuring error to be minimized.

Figure 4:
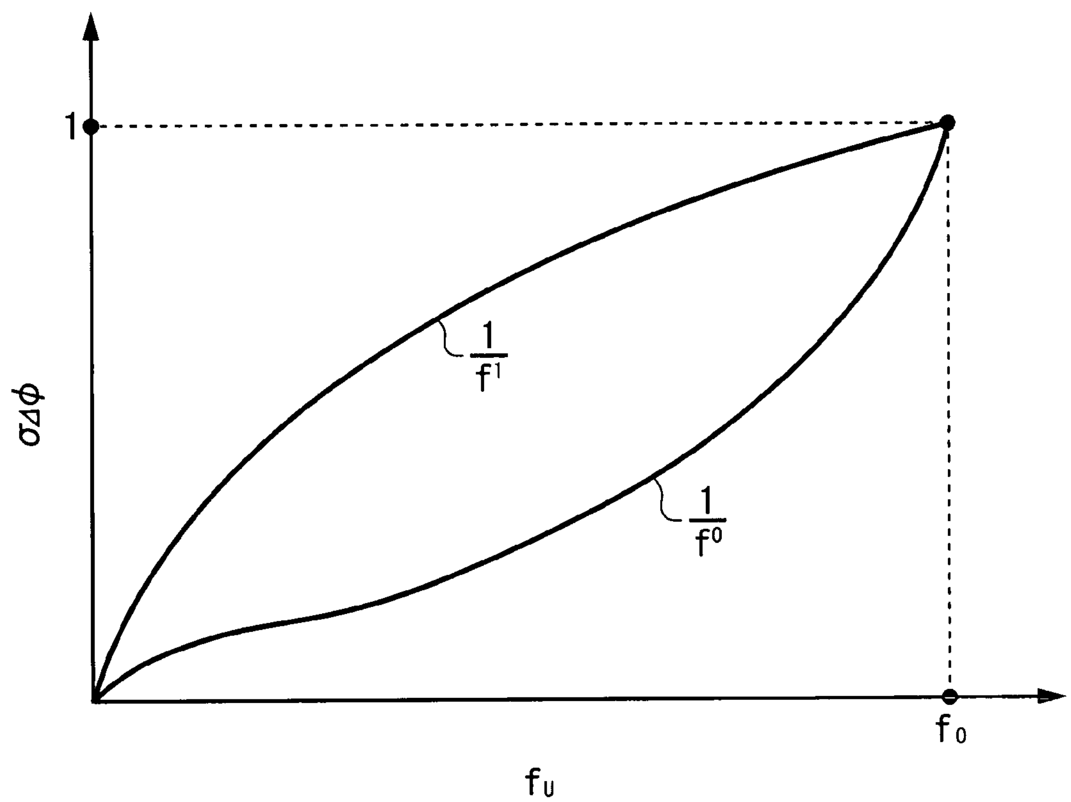
FIG. 4 is a graph showing one exemplary relationship between the integrated values of the phase noise spectrum and the band-to-be-measured for $\alpha=-1$ and 0.

FIG. 4 is a graph showing one exemplary relationship between the values of the integrated phase noise spectrum and the band-to-be-measured when $\alpha$ is −1 and 0. The axis of ordinate in FIG. 4 is the same with the axis of ordinate in FIG.

3. The axis of abscissa in FIG. 4 represents the upper cutoff frequency of the band-to-be-measured when expressed as the offset frequency. When α is −1 and 0, their integrated values diverge and do not saturate as shown in FIG. 4. Therefore, it is necessary to integrate the spectrum having such inclinations across the entire bandwidth of the frequency band having the inclinations in order to accurately calculate jitter. The bandwidth calculating section 30 may calculate the fundamental frequency (oscillating frequency or carrier frequency) $f_0$ of the signal-under-measurement as the upper cutoff offset frequency.

Figure 5:
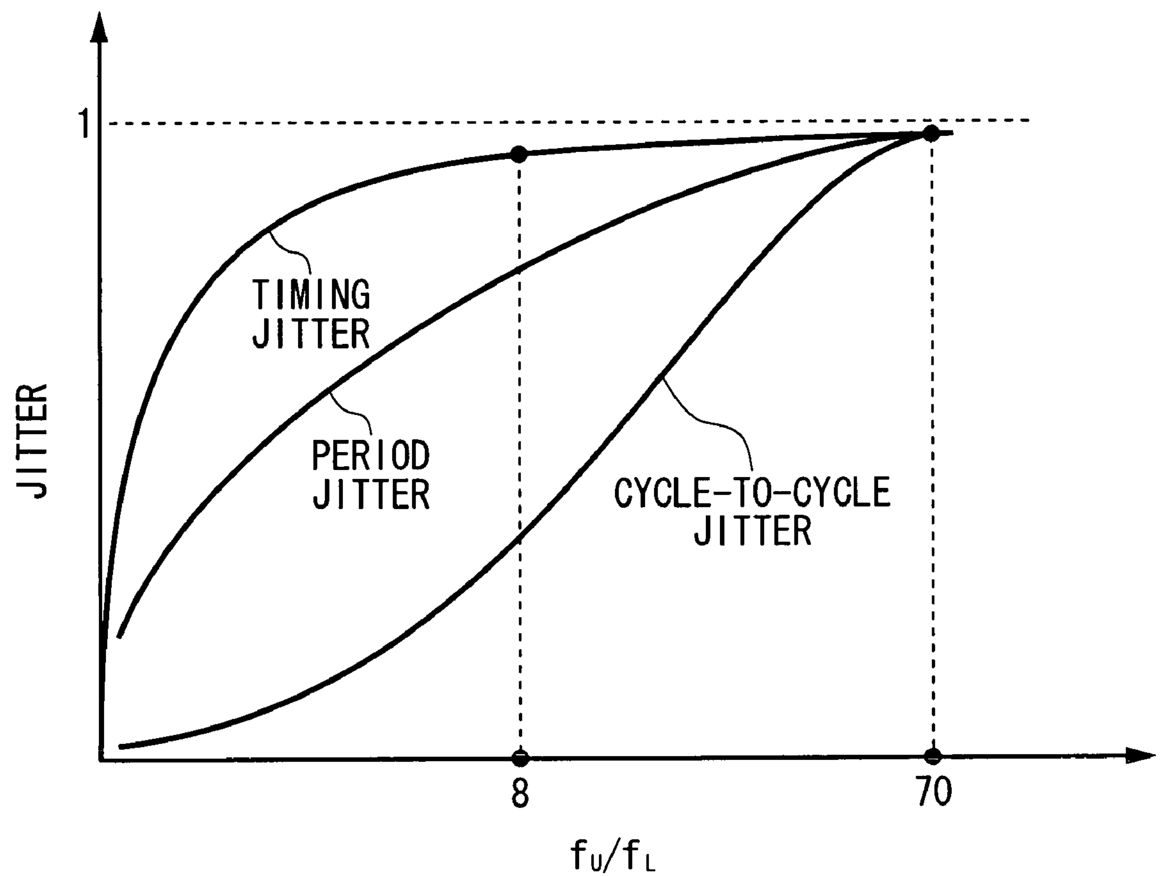
FIG. 5 is a graph showing one exemplary relationship between types of jitter to be measured and integrated values of spectra of the respective jitters.

FIG. 5 is a graph showing one exemplary relationship between types of jitter to be measured and values of integrated spectra of the respective jitters. The axes of ordinate and abscissa are the same with those in FIG. 3.

Because the timing jitter shows the low-pass characteristics as described before, the value of the integrated spectrum saturates at lower frequency. However, because the period jitter and cycle-to-cycle jitter show the band pass characteristics, the values of the integrated spectra saturate at higher frequencies. In this example, the timing jitter saturates when $f_U/f_L$ is 8. The period jitter and cycle-to-cycle jitter saturate when $f_U/f_L$ is 70. The bandwidth calculating section 30 may calculate the bands-to-be-measured thus different from each other corresponding to the type of jitter to be measured.

Figure 6:
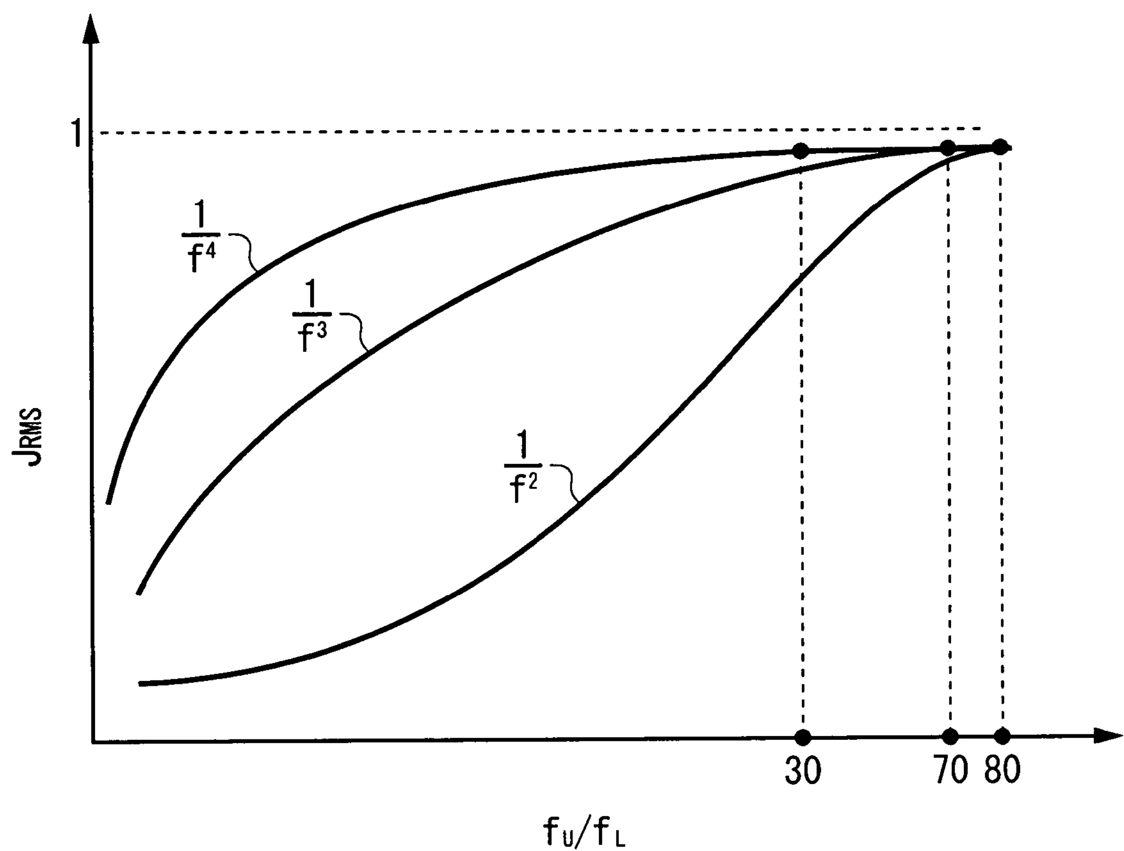
FIG. 6 is a graph showing one exemplary relationship between inclination of the spectrum of the period jitter and integrated value of the spectrum.

FIG. 6 is a graph showing one exemplary relationship between the inclination of the spectrum of the period jitter and the value of the integrated spectrum. The axes of ordinate and abscissa in FIG. 6 are the same with those in FIG. 3. Similarly to the phase noise spectrum explained in FIG. 3, the integrated value saturates at the lower frequency as the absolute value of the inclination of the spectrum becomes large. However, the upper cutoff frequency where the integrated value of each inclination of the period jitter spectrum saturates becomes greater than the upper cutoff frequency where the integrated value of each inclination of the phase noise spectrum saturates as explained in FIG. 5. In this example, when α is −4, the integrated value saturates when $f_U/f_L$ is around 30. When α is −3, the integrated value saturates when $f_U/f_L$ is around 70. When α is −2, the integrated value saturates when $f_U/f_L$ is around 80.

As explained in FIGS. 3 through 6, the upper cutoff frequencies of the band-to-be-measured necessary for saturating the value of the integrated spectrum is different from each other depending on the inclinations of the spectra and the types of jitter to be measured. Preferably, the bandwidth calculating section 30 stores the coefficient table that correlates the inclination value of the spectrum with the upper cutoff frequency per type of jitter to be measured. Still preferably, the bandwidth calculating section 30 calculates the upper cutoff frequency based on the inclination of the spectrum and the types of jitter to be measured.

FIGS. 7A shows one example of the coefficient table stored in the bandwidth calculating section 30. In this example, the bandwidth calculating section 30 stores the coefficient table that correlates the respective inclinations of the spectra with the upper cutoff frequencies for the timing jitter and period jitter.

The inclination of the spectrum is also determined by the attribute of jitter. For example, a spectrum whose inclination α=−4 corresponds to random walk frequency noise, a spectrum whose inclination α=−3 corresponds to flicker frequency noise, a spectrum whose inclination α=−2 corresponds to white frequency noise, a spectrum whose inclination α=−1 corresponds to flicker phase noise and a spectrum whose inclination α=0 corresponds to white phase noise. That is, the coefficient table correlates the attributes of jitter to be measured respectively with the upper cutoff frequency per type of jitter such as the timing jitter and period jitter.

Here, the coefficient table may store the respective upper cutoff frequencies as values obtained by multiplying respective calculating coefficients to the lower cutoff frequency $f_L$. FIG. 7B shows the upper cutoff frequency by a multiple of the lower cutoff frequency as the offset frequency from the carrier frequency $f_0$.

The coefficient table may also store the calculating coefficients as the respective upper cutoff frequencies. For instance, the lower cutoff frequency is given to the bandwidth calculating section 30. Then, the bandwidth calculating section 30 calculates the upper cutoff frequency based on the lower cutoff frequency and the look-up value from the coefficient table.

As explained in FIGS. 3 through 6, the value of the upper cutoff frequency stored in the coefficient table for the period jitter is larger than that for the timing jitter. Still more, the larger the absolute value of a indicating the inclination, the smaller the upper cutoff frequency becomes. Further, when α=−1, 0, i.e., the upper cutoff frequencies for the flicker phase noise and the white phase noise, are the carrier frequency of the signal-under-measurement.

Jitter may be measured accurately and effectively by calculating the band parameters by looking up such coefficient table and based on the types of jitter to be measured and on the attribute, i.e., the inclination, of the spectra to be measured.

FIG. 7B shows another exemplary coefficient table stored in the bandwidth calculating section 30. In this example, a case when the lower cutoff frequency is 1/100 of the carrier frequency $f_0$ will be explained. The lower cutoff frequency may be frequency set by the user.

In this case, the coefficient table shown in FIG. 7B may be obtained by substituting $f_L=f_0/100$ into Equation of each upper cutoff frequency corresponding to the coefficient table shown in FIG. 7A. The bandwidth calculating section 30 may store this coefficient table. In this case, the carrier frequency is given to the bandwidth calculating section 30. Then, the bandwidth calculating section 30 calculates the upper cutoff frequency based on the carrier frequency and the coefficient table.

Figure 8:
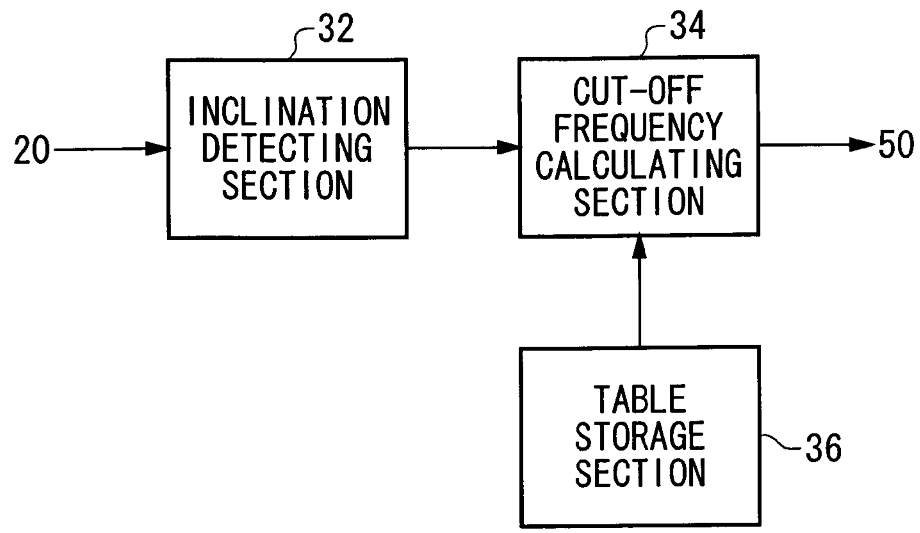
FIG. 8 is a diagram showing one exemplary configuration of the bandwidth calculating section.

FIG. 8 is a diagram showing one exemplary configuration of the bandwidth calculating section 30. The bandwidth calculating section 30 has an inclination detecting section 32, a cutoff frequency calculating section 34 and a table storage section 36. The inclination detecting section 32 calculates an inclination of spectra of a signal-under-measurement in the band-under-measurement of the signal-under-measurement in which jitter is to be measured. In the present embodiment, the inclination detecting section 32 may approximate the spectra by one or a plurality of straight lines whose inclination is given beforehand per attribute of the jitter to calculate the inclination of each straight line.

The table storage section 36 stores the coefficient tables explained in FIGS. 7A and 7B. That is, the table storage section 36 stores the coefficient tables that correlates the respective inclinations of the spectra with the calculating coefficients given in advance as described before. The table storage section 36 may also store the coefficient table per type of jitter to be measured.

The cutoff frequency calculating section 34 calculates upper cutoff frequency of the band-to-be-measured based on the inclination of the spectrum detected by the inclination detecting section 32. By being given the type of the jitter to be measure such as timing jitter and period jitter in advance, the cutoff frequency calculating section 34 searches, from the coefficient table, the upper cutoff frequency corresponding to the type of the jitter and to the inclination of straight line given from the inclination detecting section 32. For instance, based on whether the jitter calculating section 50 measures the timing jitter or the period jitter of the signal-under-measurement, the cutoff frequency calculating section 34 decides either one of the coefficient tables stored in the table storage section 36 which should be looked up. The lower cutoff frequency of the band-to-be-measured is frequency given from the user for example as described above. Then, the cutoff frequency calculating section 34 informs the jitter calculating section 50 of the calculated band parameters.

Figure 9:
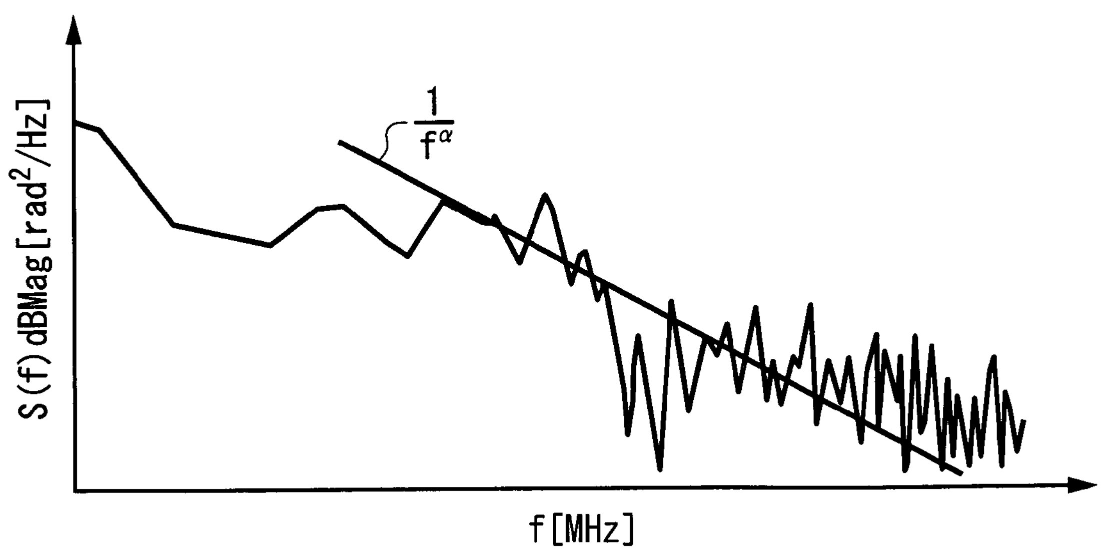
FIG. 9 is a graph showing one example of a spectrum outputted from a signal converting section.

FIG. 9 is a chart showing one example of a spectrum outputted from the signal converting section 10. FIG. 9 shows the spectrum as a log magnitude spectrum. For the decaying characteristic of the spectra, two cases—in one case, the signal-under-measurement is a power spectrum; in another case, the signal-under-measurement is phase noise spectrum—shows practically the same characteristics.

The inclination detecting section 32 approximates the log magnitude spectrum by a straight line at first. Then, the cutoff frequency calculating section 34 searches the upper cutoff frequency corresponding to the inclination of the straight line from the coefficient table. When there is no data that matches completely with the inclination in the coefficient table, the cutoff frequency calculating section 34 may select data closest to the inclination from the coefficient table.

When the coefficient table stores the multiplication coefficients described above as the upper cutoff frequency, the cutoff frequency calculating section 34 may calculate the upper cutoff frequency by multiplying the given lower cutoff frequency by the calculating coefficient corresponding to the inclination of the spectrum as explained in FIG. 7A. Still more, it may calculate the upper cutoff frequency by multiplying the carrier frequency by the calculating coefficient corresponding to the inclination of the spectrum as explained in FIG. 7B.

Figure 10:
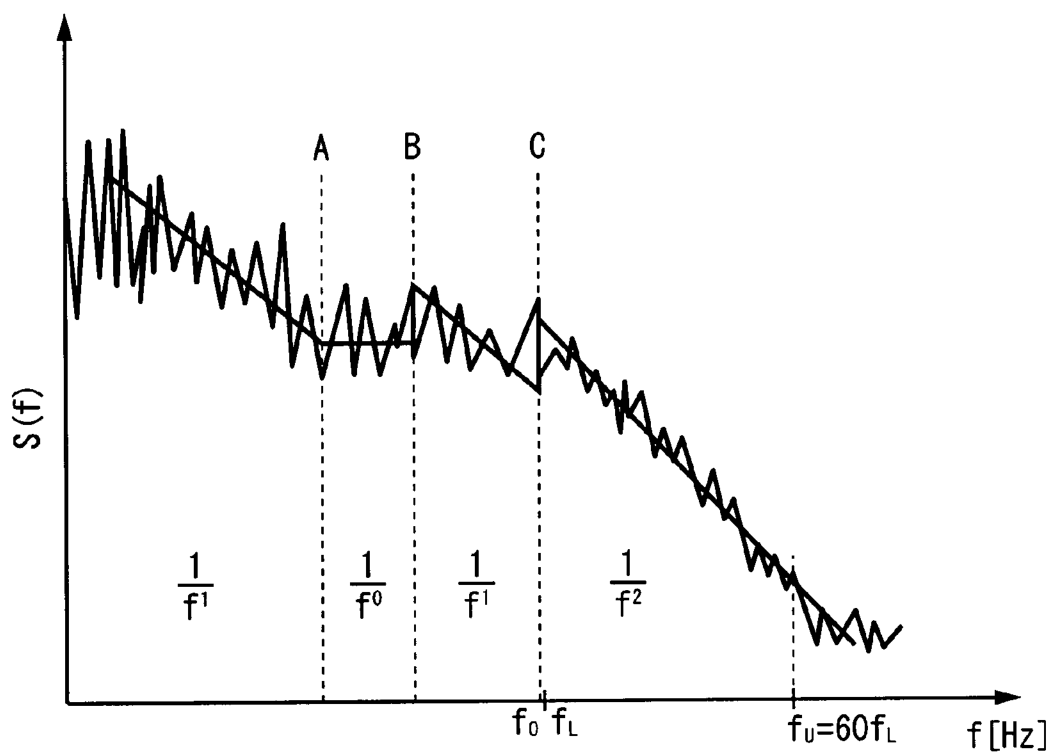
FIG. 10 is a graph showing another exemplary spectrum outputted from the signal converting section.

FIG. 10 is a graph showing another exemplary spectrum outputted from the signal converting section 10. When the spectrum is approximated by a plurality of straight lines as shown in FIG. 10, the spectrum has inflection points A, B and C.

Jitter may be measured effectively and accurately also in such a case by calculating the band parameters by the bandwidth calculating section 30 so that the saturation rate of the integrated spectrum of the signal-under-measurement over the band-to-be-measured becomes almost equal to a saturation rate set in advance.

Figure 11:
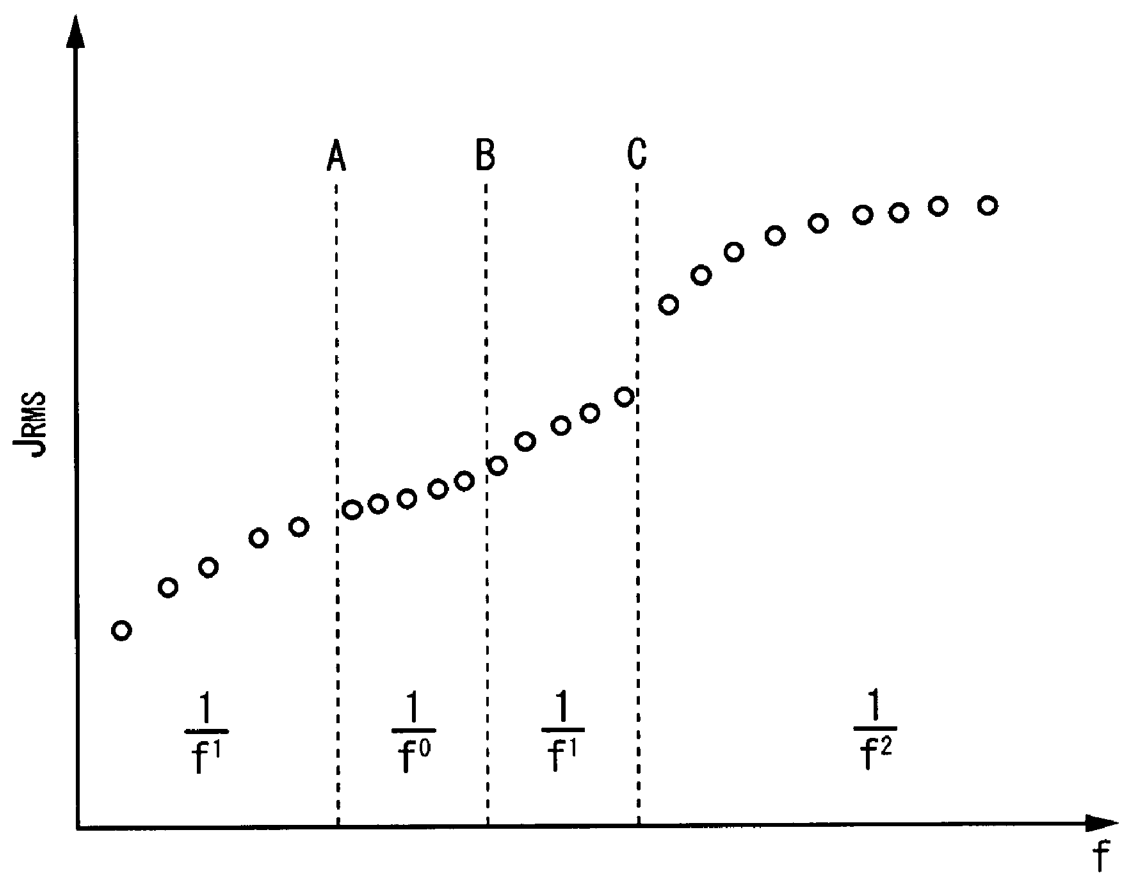
FIG. 11 is a graph showing the relationship between the band-to-be-measured and integrated values of the spectrum shown in FIG. 10.

FIG. 11 is a graph showing the relationship between the band-to-be-measured and the value of the integrated spectrum shown in FIG. 10. In FIGS. 10 and 11, the axis of abscissas thereof represents logarithmic frequency. Even when the spectrum of the signal-under-measurement is approximated by the plurality of straight lines as shown in FIG. 10, there exists frequency where the integrated value of the spectrum saturates as shown in FIG. 11. The bandwidth calculating section 30 calculates the saturating frequency as the upper cutoff frequency of the band-to-be-measured.

Figure 12:
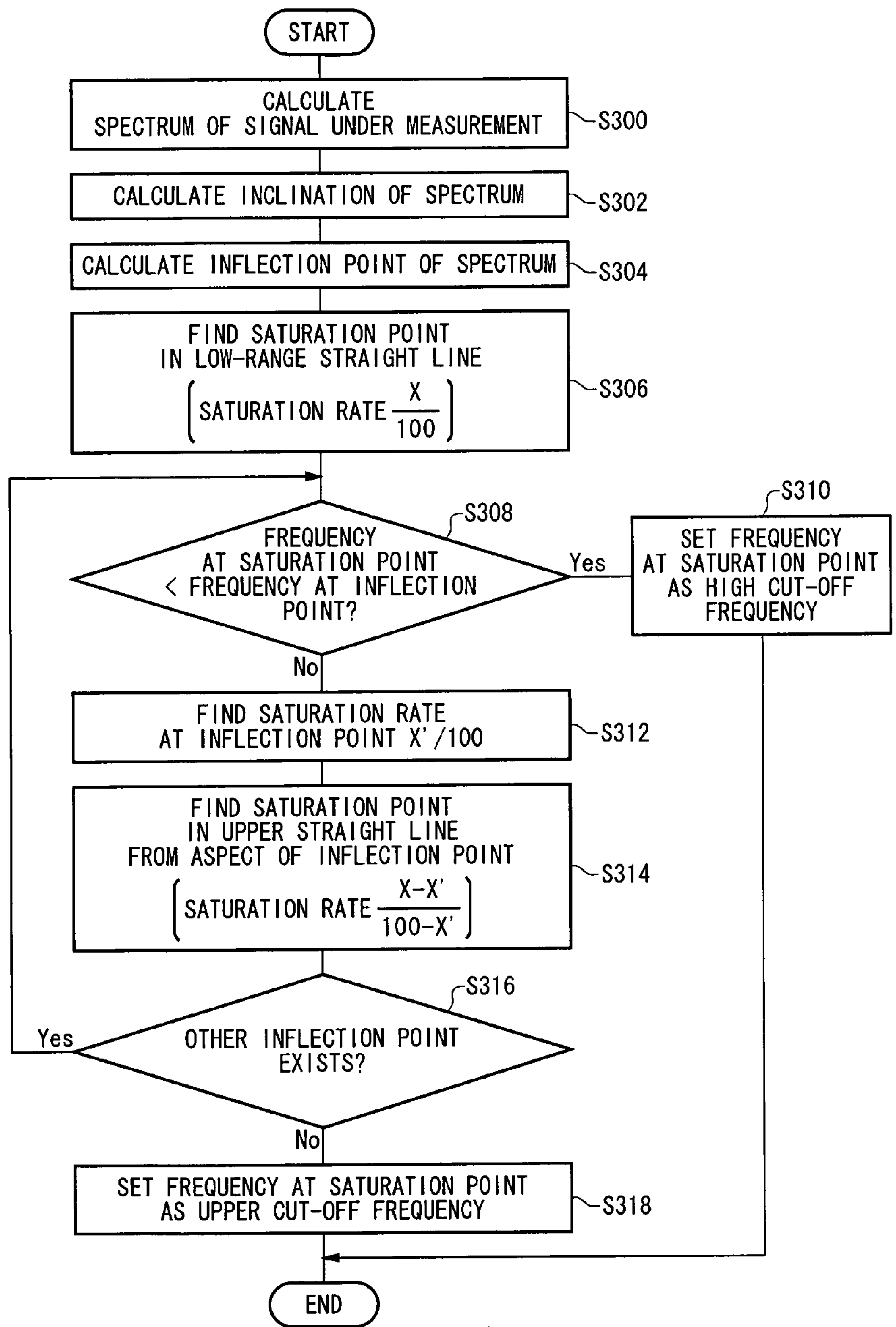
FIG. 12 is a flowchart showing one example of a method for calculating upper cutoff frequency when the spectrum of the signal-under-measurement is approximated by a plurality of straight lines.

FIG. 12 is a flowchart showing one exemplary method for calculating the upper cutoff frequency when the spectrum of the signal-under-measurement is approximated by the plurality of straight lines. The signal converting section 10 calculates a sideband spectrum of the signal-under-measurement at first in Step S300. The sideband spectrum may be a sideband of the carrier component in the power spectrum of the signal-under-measurement as described above.

Next, the inclination detecting section 32 calculates the inclination of the sideband spectrum of the signal-under-measurement in Step S302. Then, based on the calculated inclination, the inclination detecting section 32 calculates inflection points of the sideband spectrum of the signal-under-measurement in Step S304. The inclination section 32 detects the inflection points A, B and C in the sideband spectrum shown in FIG. 10.

Then, the cutoff frequency calculating section 34 calculates a saturation point associated with the straight line over the lowest range among the straight lines approximating the sideband spectrum in Step S306. In case of the example shown in FIG. 10, the cutoff frequency calculating section 34 calculates a point where the integrated value of the straight line (the straight line from the carrier frequency to the inflection point A) over the lowest band is saturated.

At this time, the cutoff frequency calculating section 34 treats the straight line as being continuously spanning to a frequency band higher than the inflection point A. Then, it detects the saturation point where the ratio of the value of the integrated spectrum in the predetermined band-under-measurement to the integrated value of the straight line to the saturation point becomes equal to a saturation rate set in advance (set as X/100 here).

Next, the cutoff frequency calculating section 34 compares the frequency of the detected saturation point with the frequency of the inflection point A in Step S308. When the frequency of the saturation point is smaller than the frequency of the inflection point A, the cutoff frequency calculating section 34 calculates the frequency of the saturation point as the upper cutoff frequency of the band-to-be-measured in Step S310.

When the frequency of the saturation point is larger than the frequency of the inflection point A, that straight line cannot exist in the frequency of the saturation point. Therefore, the frequency of that saturation point should not be used as the upper cutoff frequency of the band-to-be-measured. In such a case, the cutoff frequency calculating section 34 calculates a saturation rate (X'/100) from the carrier frequency to the inflection point A in Step S312. Then, setting the frequency of the inflection point A as the lower cutoff frequency, the cutoff frequency calculating section 34 calculates a saturation point associated with the straight line in the range higher than the inflection point A in Step S314. In Step S314, the cutoff frequency calculating section 34 calculates a threshold saturation rate for detecting the saturation point as (X−X')/(100−X'). That is, the cutoff frequency calculating section 34 detects the saturation point where the entire saturation rate combining the straight line in the lower range with the straight line becomes X/100.

Next, the cutoff frequency calculating section 34 detects whether there exists an inflection point whose frequency is higher than the frequency of the inflection point A in Step S316. We have the inflection points B and C whose frequencies are higher than the frequency of the inflection point A in this example. When such inflection points exist, the processes in Steps S308 through S316 are repeated for the inflection point (the inflection point B in this case) from lower frequency to the next higher frequency. When no other inflection point is detected in Step S316, the cutoff frequency calculating section 34 calculates the saturation point calculated last in S314 as the upper cutoff frequency in Step S318.

The upper cutoff frequency in the band-to-be-measured for the spectrum approximated by the plurality of straight lines may be calculated under such control.

Figure 13:
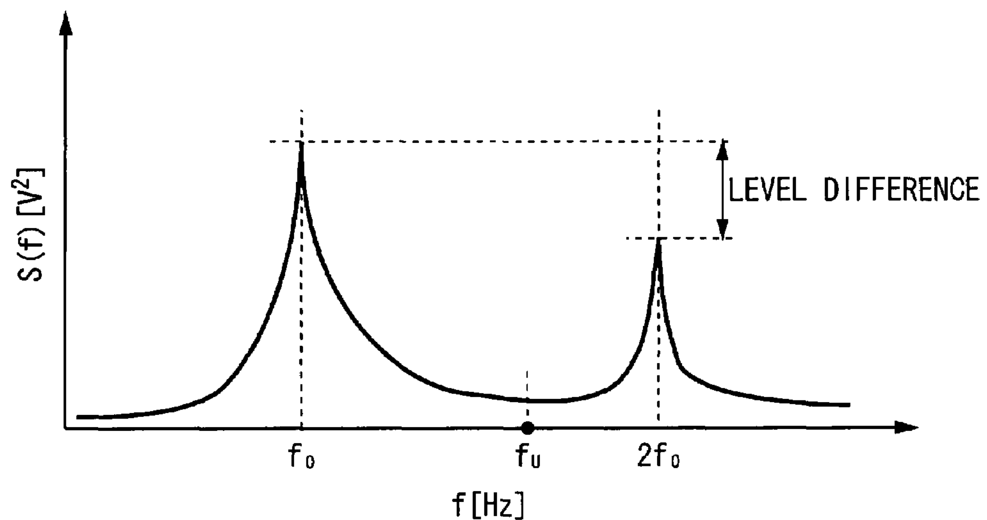
FIG. 13 is a graph showing another example for calculating the band parameters.

FIG. 13 is a chart showing another example for calculating the band parameters. In this example, the bandwidth calculating section 30 calculates the band parameters based on a level difference between a peak level of a fundamental in the spectrum outputted from the signal converting section 10 and a peak level of the second harmonic and on the inclination of the sideband specta of the fundamental.

Figure 14:
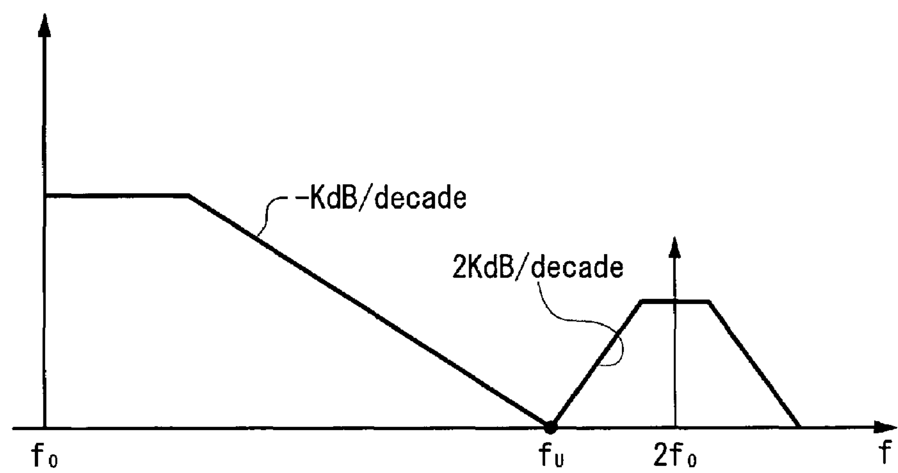
FIG. 14 is a diagrammatic graph showing a fundamental and a second harmonic.

FIG. 14 is a diagrammatic chart showing the fundamental and the second harmonic. The bandwidth calculating section 30 of the present embodiment calculates a cross-point of upper sidebands of the fundamental and lower sidebands of the second harmonic as the upper cutoff frequency.

When the inclination of the straight line approximating the upper sidebands of the fundamental is assumed to be −K, the inclination of the straight line approximating the lower sidebands of the second harmonic is given by 2K in general. Still more, amplitude of the peak of the second harmonic decays by L [dBR] from amplitude of the peak of the fundamental. Therefore, the greater the level difference, the closer the cross-point approaches to the second harmonic, and the frequency at the cross-point may be calculated from the inclination of the fundamental and the level difference.

For instance, offset frequency $f_B$ of the cross-point to peak frequency $f_0$ of the fundamental may be calculated by the following equation:

$$f_B=(f_0^2 f_L 10^{L/K})^{1/3}$$

where $f_0$ is the peak frequency of the fundamental and $f_L$ is the offset frequency of the lower cutoff frequency. The offset frequency of the lower cutoff frequency is $f_0/100$ for example. It becomes possible to prevent a contribution of the second harmonic from becoming greater than that of the fundamental by setting such offset frequency as the offset frequency of the upper cutoff frequency. Thereby, jitter may be calculated accurately.

Still more, because the phase noise spectrum is a two-sided spectrum, it is preferable to measure jitter in the band-to-be-measured from $f_0-f_5$ to $f_0+f_5$ in order to accurately measure the jitter.

Figure 15:
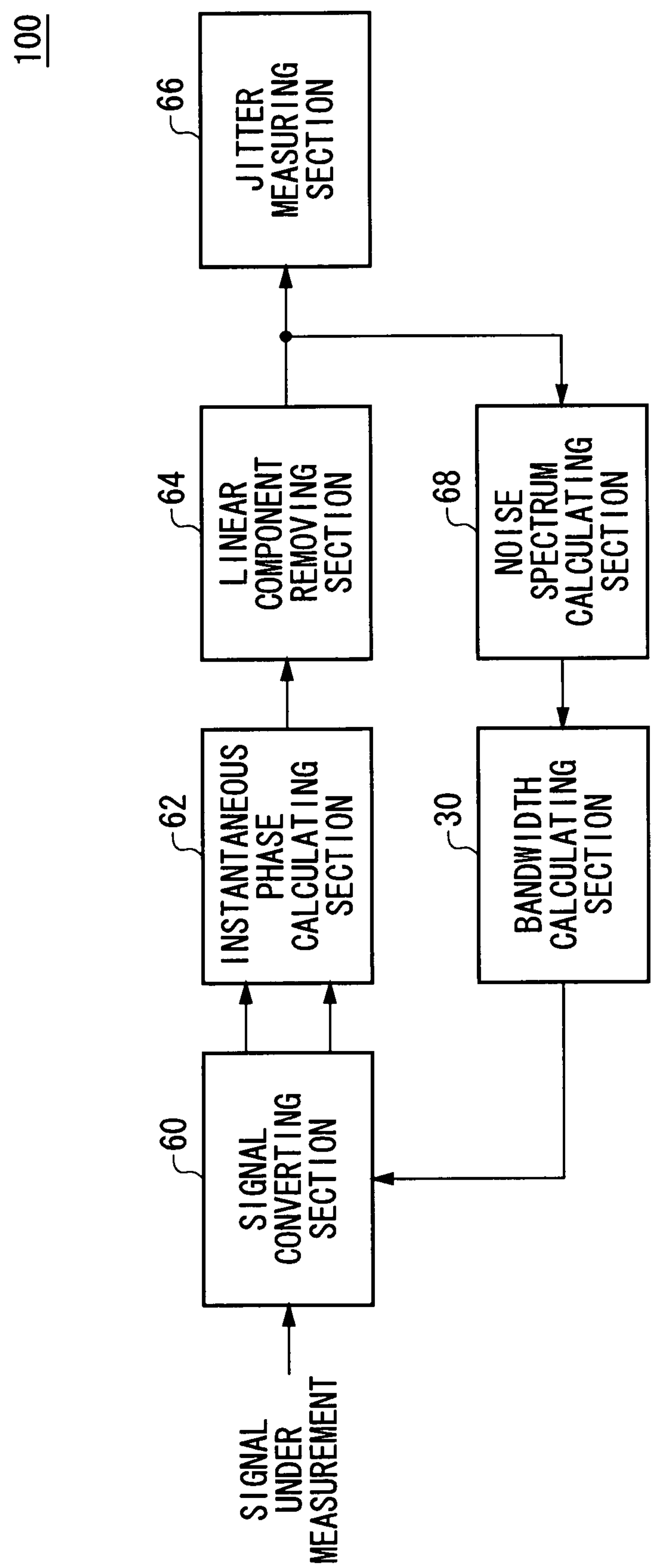
FIG. 15 is a diagram showing another exemplary configuration of the jitter measuring apparatus.

FIG. 15 is a diagram showing another exemplary configuration of the jitter measuring apparatus 100. The jitter measuring apparatus 100 of this example determines the band-to-be-measured based on the inclination of the phase noise spectrum. The jitter measuring apparatus 100 has a signal converting section 60, an instantaneous phase calculating section 62, a linear component removing section 64, a jitter measuring section 66, a noise spectrum calculating section 68 and the bandwidth calculating section 30.

The signal converting section 60 converts the signal-under-measurement into the analytical signal. The signal converting section 60 may have a Hilbert transformation filter for Hilbert-transforming the signal-under-measurement for example. The instantaneous phase calculating section 62 calculates the instantaneous phase of the signal-under-measurement based on the analytical signal. For instance, the instantaneous phase calculating section 62 calculates the instantaneous phase from a ratio of a real signal to an imaginary signal of the analytical signal. The instantaneous phase calculating section 62 also unwraps the instantaneous phase. For instance, the instantaneous phase calculating section 62 transforms the instantaneous phase having a sawtooth-like waveform into a signal having a waveform of almost straight line.

The linear component removing section 64 removes a linear component of the unwrapped instantaneous phase of the signal-under-measurement to calculate instantaneous phase noise of the signal-under-measurement. For instance, the linear component removing section 64 calculates the instantaneous phase noise by removing the instantaneous phase having no noise in the signal-under-measurement from the instantaneous phase outputted from the instantaneous phase calculating section 62.

The noise spectrum calculating section 68 calculates the spectrum of the instantaneous phase noise. The noise spectrum calculating section 68 may calculate the spectrum of the instantaneous phase noise by Fourier transform for example.

The bandwidth calculating section 30 calculates the band parameters of the spectrum to be looked up to calculate jitter based on the inclination of the spectra of the instantaneous phase noise in the band-to-be-measured from which the jitter is to be measured. The bandwidth calculating section 30 has the same function and configuration with the bandwidth calculating section 30 explained in connection with FIG. 1. Then, corresponding to the calculated band parameters, the bandwidth calculating section 30 controls a pass bandwidth of the filter of the signal converting section 60. The bandwidth calculating section 30 may control the band-to-be-measured of the jitter measuring section 66 corresponding to the calculated band parameters.

The instantaneous phase calculating section 62 and the linear component removing section 64 calculate the instantaneous phase noise based on the analytical signal outputted from the signal converting section 60 for the band-to-be-measured. Then, the jitter measuring section 66 measures jitter in the signal-under-measurement based on the instantaneous phase noise.

Having such structure, the jitter measuring apparatus 100 of this example can measure jitter in the signal-under-measurement accurately and effectively similarly to the jitter measuring apparatus 100 explained in connection with FIG. 1. Still more, as shown in FIGS. 1 and 15, the method for measuring jitter by calculating the optimum band-to-be-measured from which the jitter is to be measured from the inclination of the spectra may be applied to various jitter measuring methods. For instance, jitter may be measured accurately and effectively by calculating the optimum band-to-be-measured in the methods for measuring jitter by means of the time interval analyzer, the real-time oscilloscope, the analog type spectrum analyzer and others.

The detail of the theory for determining the band-to-be-measured from the inclination of spectrum will be explained below. In this example, a case of determining the band-to-be-measured that minimizes an error and measuring time from the inclination of power spectrum $S_{\Delta\phi\Delta\phi}(f_J)$ of the phase noise will be explained. The jitter measuring apparatus 100 explained in FIGS. 1 through 15 may determine the band-to-be-measured based on the inclination of the power spectra of the phase noise.

A function of the power-law spectrum of the phase noise may be given by the following equation:

$$S_{\Delta\phi\Delta\phi}(f_J)=h_\alpha f_J^\alpha \quad f_L<f_J f_U \qquad \text{Eq. 1}$$

where, $f_J\hat{}\alpha$ corresponds to an inclination of the function when log of the frequency is represented by the axis of abscissa and magnitude of the spectrum is represented by the axis of ordinate. Still more, $h_\alpha$ indicates magnitude of the peak of the spectrum for example and is a constant. $f_L$ and $f_U$ indicate the lower cutoff frequency (offset frequency) and the upper cutoff frequency (offset frequency).

The following equation may be obtained from Equation 1 by calculating a mean square value of the instantaneous phase noise in the band-to-be-measured:

$$\sigma_{\Delta\phi}^2\left(\frac{f_L}{f_0},\frac{f_U}{f_0}\right)=2\int_{f_L/f_0}^{f_U/f_0}h_\alpha f_J^\alpha df_J \quad \text{Eq. 2}$$

That is;

$$\sigma_{\Delta\phi}^2\left(\frac{f_L}{f_0},\frac{f_U}{f_0}\right)\propto\begin{cases}\frac{1}{\alpha+1}\left[\left(\frac{f_U}{f_0}\right)^{\alpha+1}-\left(\frac{f_L}{f_0}\right)^{\alpha+1}\right] & \alpha=-4,-3,-2,0\\ \log\left(\frac{f_U}{f_0}\right)-\log\left(\frac{f_L}{f_0}\right) & \alpha=-1\end{cases} \quad \text{Eq. 3}$$

At first, the optimum band-to-be-measured will be considered. When α=−4, −3 and −2, Equation 3 may be expressed as follows;

$$\sigma_{\Delta\phi}^2\left(\frac{f_L}{f_0},\frac{f_U}{f_0}\right)\propto\frac{1}{-\alpha-1}\left(\frac{f_L}{f_0}\right)^{\alpha+1}\left[1-\left(\frac{f_U}{f_L}\right)^{\alpha+1}\right] \quad \text{Eq. 4}$$

When the band-to-be-measured $[f_L, f_U]$ is taken to be sufficiently large, $(f_U/f_L)$^α+1 becomes sufficiently small because α is a minus value and Equation 4 saturates to a constant value. However, the band-to-be-measured that saturates Equation (4) to the constant value depends on the ratio of the lower cutoff frequency to the upper cutoff frequency and on α and cannot be determined only by the lower cutoff frequency. Because the function of the spectrum continuously decreases monotonously at constant inclination to the lower cutoff frequency, upper cutoff frequency that gives the optimum band-to-be-measured exists even when arbitrary frequency is set as the lower cutoff frequency. At this time, even if an area of the power spectrum is found to the frequency larger than the upper cutoff frequency, it will not become larger than the area in the band-to-be-measured and saturates to a constant value.

Next, the lower cutoff frequency will be considered. Because the phase noise spectrum presents roll-off characteristics, Equation 3 may be considered as follows when the lower cutoff frequency is sufficiently smaller than the upper cutoff frequency:

$$\sigma_{\Delta\phi}^2\left(\frac{f_L}{f_0},\frac{f_U}{f_0}\right)\approx\frac{1}{\alpha+1}\left(\frac{f_L}{f_0}\right)^{\alpha+1} \quad \text{Eq. 5}$$

The equation 5 indicates that when an oscillator has the sharp roll-off characteristics, the observation must be made from the sufficiently smaller lower cutoff frequency.

The lower cutoff frequency of the band-to-be-measured may be frequency given by the user corresponding to the roll-off characteristics of the oscillator as explained in FIG. 3. That is, arbitrary lower cutoff frequency is set. The upper cutoff frequency that gives the optimum band-to-be-measured exists also for such arbitrary lower cutoff frequency as described above.

Next, the upper cutoff frequency will be considered. Here, the explanation will be made by assuming the lower cutoff frequency as $f_0/100$. When $f_U=f_0/10$ and α=−4 for example, $(f_U/f_0)$^α+1=10^3 is sufficiently smaller than $(f_L/f_0)$^α+1=10^6 and an error that is caused by not measuring the frequency band higher than the upper cutoff frequency is negligible. That is, it can be understood that the ideal upper cutoff frequency is smaller than at least $f_U=f_0/10$. For instance, when α=−4, −3, the measuring error becomes sufficiently small by observing to the frequency where $f_U=8f_L=f_0\times8/100$. However, if $f_U=f_0/10$ when α=−2, $(f_U/f_0)$^α+1=10 turns out to be $(f_L/f_0)$^α+1=10^2, causing about 10% of error which cannot be ignored. When α=−2, the error may be made sufficiently small by observing up to around the upper cutoff frequency $f_U=60f_L$.

That is, it can be seen that the mean square value of the phase noise spectrum cannot be accurately measured unless the upper cutoff frequency is set at higher frequency when the absolute value of the inclination of the power-law spectrum is small.

Still more, Equation 3 diverges when α=−1, 0. That is, when the upper cutoff frequency is set to be infinite, the mean square value of the phase noise spectrum of Equation 3 becomes infinite. In such a case, the phase noise spectrum may be measured by setting the frequency corresponding to the inflection point on the lower range side of the straight line from which the mean square value of the phase noise spectrum is to be measured as the lower cutoff frequency and the frequency corresponding to the inflection point on the upper range side as the upper cutoff frequency.

Next, the case of measuring the period jitter will be explained. A mean square value of the period jitter may be given by the following equation:

$$J_{\mathrm{RMS}}^2\left(\frac{f_L}{f_0},\frac{f_U}{f_0}\right)=8f_0^{\alpha+1}\int_{f_L/f_0}^{f_U/f_0}h_\alpha f_J^\alpha\sin^2(\pi f_J)df_J \quad \text{Eq. 6}$$

When Equation 6 is developed and the lower cutoff frequency is set as $f_0/100$ similarly to Equations 3 through 5 in the phase noise spectrum, the upper cutoff frequency by which the error becomes sufficiently small to each α is the value shown in FIG. 7.

In measuring the cycle-to-cycle jitter, a mean square value of the cycle-to-cycle jitter may be given by the following equation:

$$J_{CC,\mathrm{RMS}}^2\left(\frac{f_L}{f_0},\frac{f_U}{f_0}\right)=32f_0^{\alpha+1}\int_{f_L/f_0}^{f_U/f_0}h_\alpha f_J^\alpha\sin^4(\pi f_J)df_J \quad \text{Eq. 7}$$

When Equation 7 is developed and the lower cutoff frequency is set as $f_0/100$ similarly to Equations 3 through 5 in the phase noise spectrum, the upper cutoff frequency where the error becomes sufficiently small is almost the same with the case of measuring the period jitter.

As it is apparent from the above description, according to the invention, the measuring error and measuring time may be minimized by calculating the optimum band-to-be-measured wherein the signal-under-measurement is to be observed in the jitter measuring apparatus for measuring jitter in the signal-under-measurement.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A jitter measuring apparatus for measuring jitter in a signal-under-measurement, comprising:

a signal converting section for calculating a spectrum of said signal-under-measurement;

a bandwidth calculating section for calculating band parameters where, for each of a plurality of inclinations of the spectrum, a value of an integrated spectrum of said signal-under-measurement over a determined band-to-be-measured becomes almost equal to an integrated value the spectrum over an entire bandwidth of the signal-to-be-measured; and a jitter calculating section for measuring said jitter in said signal-under-measurement based on said spectrum of each band-to-be-measured of the plurality of inclinations of said signal-under-measurement.

2. The jitter measuring apparatus as set forth in claim 1, wherein said bandwidth calculating section calculates an upper cutoff frequency for each inclination of said spectrum of said signal-under-measurement.

3. The jitter measuring apparatus as set forth in claim 2, wherein said bandwidth calculating section has an inclination detecting section for detecting the plurality of inclinations of the spectrum to approximate an envelope of said spectrum; and a cutoff frequency calculating section for calculating said upper cutoff frequency for each inclination based on the inclination.

4. The jitter measuring apparatus as set forth in claim 3, wherein said cutoff frequency calculating section calculates, for each inclination, said upper cutoff frequency of the inclination by multiplying a calculating coefficient corresponding to the inclination to a frequency given as lower cutoff frequency of the inclination.

5. The jitter measuring apparatus as set forth in claim 4, wherein said bandwidth calculating section also has a table storage section for storing a coefficient table that correlates each of the plurality of inclinations with the calculating coefficients, wherein absolute values of the calculating coefficients decrease as absolute values of the plurality of inclinations of become large; and said cutoff frequency calculating section calculates said upper cutoff frequency for each inclination by using the calculating coefficient corresponding to the inclination.

6. The jitter measuring apparatus as set forth in claim 1, wherein said bandwidth calculating section calculates, for each inclination, said upper cutoff frequency of the inclination based on a difference between a peak level of a fundamental frequency and a peak level of a second harmonic in said spectrum of the inclination.

7. The jitter measuring apparatus as set forth in claim 3 wherein, for each inclination, said cutoff frequency calculating section calculates a lower cutoff frequency of said band-to-be-measured of the inclination based on said upper cutoff frequency and an inclination of straight lines approximating the envelope of said spectrum.

8. The jitter measuring apparatus as set forth in claim 1, wherein said signal converting section calculates a power-law spectrum of said signal-under-measurement as said spectrum of said signal-under-measurement.

9. A jitter measuring method for measuring jitter in a signal-under-measurement, comprising:

a signal converting step of calculating a spectrum of said signal-under-measurement;

a bandwidth calculating step of calculating where, for each of a plurality of inclinations of the spectrum, a value of an integrated spectrum of said signal-under-measurement over a determined band-to-be-measured becomes almost equal to an integrated value of the spectrum over an entire bandwidth of the signal-to-be-measured; and a jitter calculating step of measuring said jitter in said signal-under-measurement based on said spectrum of each band-to-be-measured of the plurality of inclinations of said signal-under-measurement.

* * * * *